United States Patent [19]
Brauer

[11] Patent Number: 5,309,979
[45] Date of Patent: May 10, 1994

[54] SELF CLAMPING HEAT SINK ASSEMBLY

[75] Inventor: Eric A. Brauer, Indianapolis, Ind.

[73] Assignee: Delco Electronics Corp., Kokomo, Ind.

[21] Appl. No.: 72,962

[22] Filed: Jun. 8, 1993

[51] Int. Cl.5 .......................... F28F 7/00; H05K 7/20
[52] U.S. Cl. .................... 165/80.2; 174/16.3;
257/718; 257/719; 361/704; 361/709
[58] Field of Search ............... 165/185, 80.3, 80.1;
174/16.3; 257/718, 719; 361/386, 388, 389

[56] References Cited

U.S. PATENT DOCUMENTS

| | | | |
|---|---|---|---|
| 4,707,726 | 11/1987 | Tinder | 257/718 X |
| 4,972,294 | 11/1990 | Moses, Jr. et al. | 361/386 |
| 5,031,028 | 7/1991 | Galich et al. | 257/718 X |
| 5,060,112 | 10/1991 | Cocconi | 361/386 |
| 5,225,965 | 7/1993 | Bailey et al. | 361/386 |

FOREIGN PATENT DOCUMENTS

| | | | |
|---|---|---|---|
| 3440334 | 5/1986 | Fed. Rep. of Germany | 257/718 |
| 252157 | 11/1987 | Japan | 257/718 |
| 11897 | 8/1991 | World Int. Prop. O. | 257/718 |

Primary Examiner—John Rivell
Assistant Examiner—L. R. Leo
Attorney, Agent, or Firm—Mark A. Navarre

[57] ABSTRACT

A heat sink assembly for clamping stand-up power components to a heat sink wherein the components are mounted on a circuit board and enclosed within a housing. A spring clamp lightly clamps an electrical component to a heat sink during a soldering process. Thereafter, the housing assembly sandwiches the electrical component between the spring clamp and a heat sink; thus ensuring optimum heat dissipation from and stability of the electrical component.

3 Claims, 2 Drawing Sheets

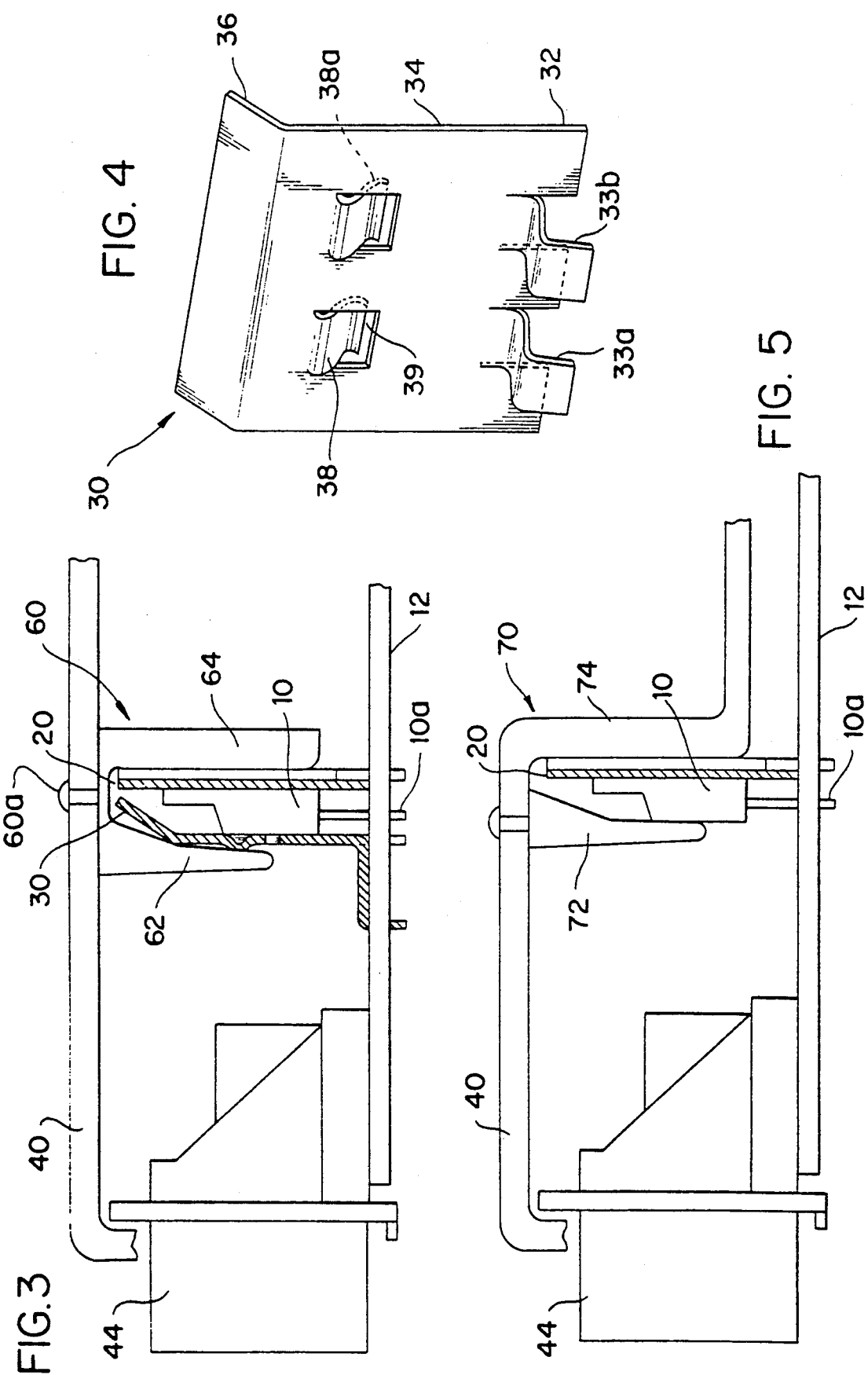

SELF CLAMPING HEAT SINK ASSEMBLY

BACKGROUND OF THE INVENTION a) Field of the Invention

The instant invention relates to a method and apparatus for clamping stand-up power components to a heat sink wherein the components are mounted on a circuit board and enclosed within a housing. By utilizing features of the heat sink and the housing assembly, forces are applied to a retaining spring to effectively clamp the respective electrical components individually to a heat sink surface, and to stabilize the component within an electrical assembly.

b) Description of Related Art

Most electrical components generate thermal energy. Some such devices generate so much heat that the device itself may be damaged or may operate improperly unless excess thermal energy is removed during operation. Mechanical and thermal contact assemblies in the form of heat sinks of various forms are conventionally used to protect electronic devices from excess heat. Typically, mechanical and thermal contact assemblies require additional mounting structures, such as rivets, screws, or other hardware, to attach or contact the electrical component to the heat sink.

In an effort to eliminate the additional mounting structures, the prior art teaches the use of spring clips to attach the electronic components to the heat sink(s). These spring clips normally have a first end which is received in the heat sink or circuit board, and a second end which is adapted to mate with and clamp the electrical component to the heat sink. However, this clip requires a high insertion force, and is not suitable for stand-up power components.

U.S. Pat. No. 4,972,294 discloses a clip having a first end which is pivotally anchored to a circuit board, a second end which is removably fastened to the heat sink, and an intermediate portion having a resilient member which engages the electrical component to bias the component toward the heat sink. However, the clip taught by U.S. Pat. No. 4,972,294 must be particularly formed for each heat sink and component type. Moreover, the clip may become disengaged from the heat sink during use, thus reducing the heat transfer efficiency.

SUMMARY OF THE INVENTION

The present invention incorporates the advantages of using a spring clamp to individually clamp electrical components to a heat sink, and additionally provides a sandwiching assembly without the use of additional fasteners.

The invention comprises a spring clamp to hold the components during the soldering process by lightly clamping the components to the heat sink. The housing is further provided with a sleeve member which bears against the spring/component assembly, and transfers a substantial load to the components; thus sandwiching the heat sink, electrical component, and string clamp together The housing sleeve features an angled surface which cams the spring clamp against the component as the housing as applied to the circuit board, thus sandwiching the heat generating electrical component between the spring clamp and the heat sink. This assembly requires no additional components, such as screws, fasteners, or the like; yet, efficiently and simply provides for optimum heat transfer from the electrical components.

Other features and advantages of the present invention will become apparent from the following description of the preferred embodiment, taken in conjunction with accompanying drawings, which illustrate, by way of example, the principles of the invention.

BRIEF DESCRIPTION OF THE DRAWINGS

FIG. 3 is a side elevation view of the heat sink assembly being received and secured in the housing in accordance with the second embodiment of the invention.

FIG. 4 is a perspective view of the spring clip of the invention.

FIG. 5 is a side elevation view of the heat sink assembly being received and secured in the housing in accordance with the third embodiment of the invention.

DETAILED DESCRIPTION OF THE PREFERRED EMBODIMENT

The following description of the present invention is not to be taken in a limiting sense, but is made merely for the purpose of illustrating the general principles of the invention. The description presents the best contemplated modes of carrying out the present invention.

Figure 1:
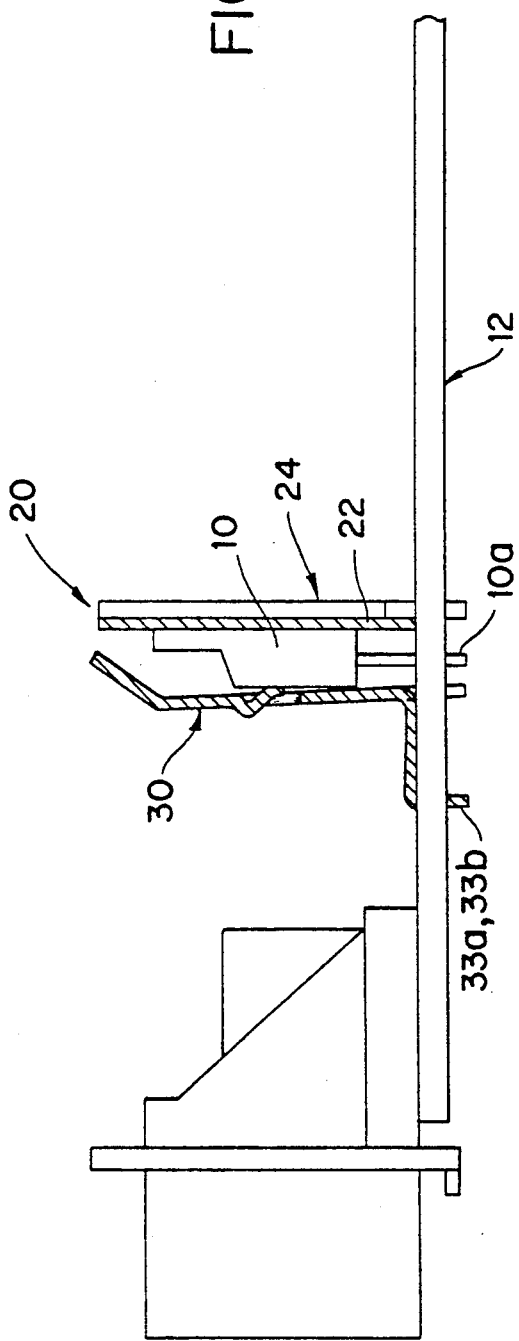
FIG. 1 is a side elevation view of the heat sink assembly wherein the spring clip lightly clamps an electrical component to the heat sink during the soldering process.

With reference to FIG. 1, an electrical component 10 is mounted on a circuit board 12 via leads 10a which extend through apertures provided in the circuit board 12 in a known manner. The electrical component 10 of the preferred embodiment is a stand-up power component, such as a transistor, transformer, inductor or the like.

Adjacent to each component is a heat sink 20 for dissipating heat from the heat generating electrical device 10. Each component 10 respectively has at least one planar, heat transfer surface or insulator 22 affixed to a support plate 24. Both the support plate 24 and heat transfer surface 22 are situated perpendicular to the surface defined by the board 12.

As illustrated in FIG. 1, the preferred embodiment of the invention comprises a unitary member 30 which is substantially rigid and elongated. The member 30 acts as a spring clamp, and may be made from any substantially rigid but resilient material such as steel, aluminum, metal alloys, or resilient non-conductive material. Where the electronic component is to be electrically isolated, the clamp 30 may be made from suitable non-conductive material such as plastic or the like, or may be made from conductive matter provided with an appropriate insulating coating (not shown).

With reference to FIG. 4, the spring clamp 30 comprises a first end portion 32 and a second end portion 36 joined by a central portion 34. The first end portion 32 is formed to be mounted in a snap-in manner on the circuit board 12 through apertures provided therein. The mounting is enhanced by means of legs 33a and 33b formed at the first end portion 32 in the manner shown in FIG. 4. The second end portion 36 is formed to extend beyond the electric component and to substantially the same height as insulator 22 and support plate 24. Central portion 34 interconnects the first and second end portions 32 and 34. Spring fingers 38 are formed in the opening 39 of the central portion 34. The spring fingers are curled at their free ends to form an engagement surface 38a for contacting the electronic component 10. While the spring clamp has been particularly described, the referenced illustrations are not intended to preclude the us of similar resilient members which lightly clamp the electrical component against the heat sink.

With reference to FIG. 1, the spring clamp 30 lightly clamps the component 10 against the heat sink 20 during the soldering process which is accomplished in a known manner. Therefore, the clamp 30 does not require a large insertion force. While the arrangement of the invention is particularly suitable for stand-up type electrical components, it should be noted that the present invention encompasses all electric components which are positioned on a circuit board, adjacent a heat sink element.

Figure 2:
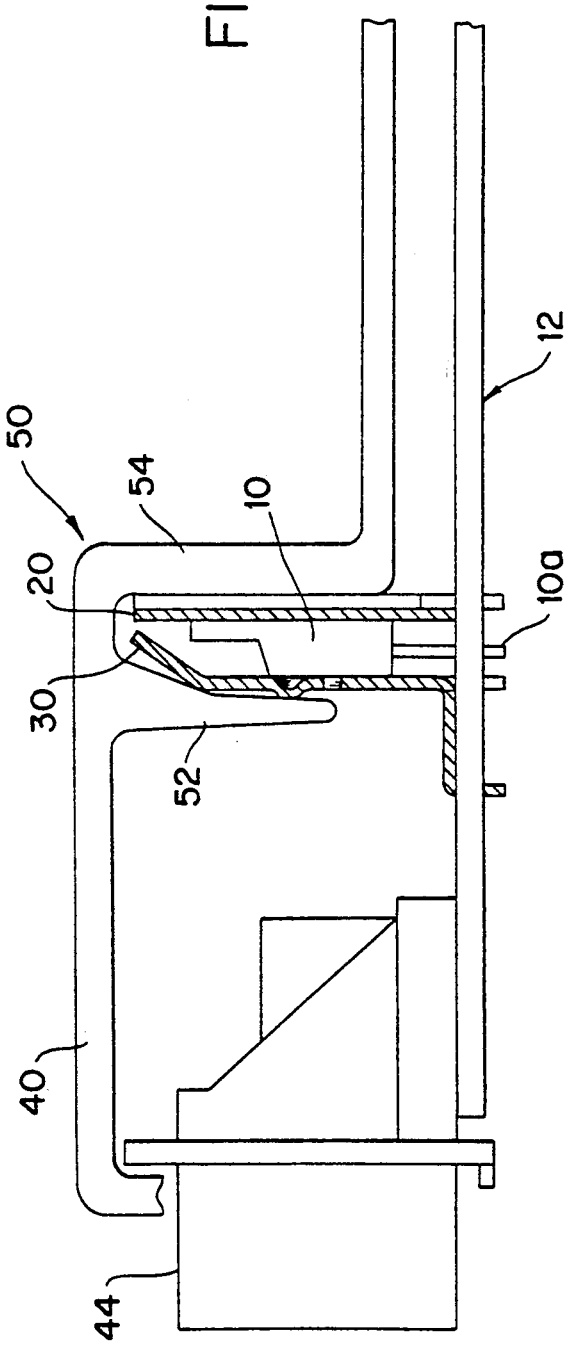
FIG. 2 is a side elevation view of the heat sink assembly being received and secured in the housing in accordance with a first embodiment.

After the soldering process is complete, the electronic equipment housing is assembled as shown by way of example in FIG. 2. Specifically, the housing cover member 40 is positioned over the circuit board 12 so as to enclose an area defined between the circuit board and the housing cover 40. As shown in FIG. 2, the housing cover member 40 may also be formed to enclose and/or surround a control panel or header 44 of the electrical equipment.

The housing member 40 is provided with an integrally formed sleeve portion shown generally as 50 in FIG. 2. The sleeve portion comprises a angled first wall 52 and a second wall 54. The first wall 52 contacts the spring clamp 30, while the second wall 54 contacts the heat sink 20 at a position opposite the electric component 10. The first and second walls 52, 54 are disposed at a suitable distance from each so as to firmly sandwich the electronic component 10 between the spring clamp 30 and the heat sink 20. The sandwiching function of the sleeve portion 50 serves to ensure optimum heat dissipation from the component 10, and to stabilize the component 10 within the electrical equipment.

Therefore, during assembly of the electrical equipment the electric component 10 is mounted on the circuit board 12 adjacent a heat sink 20. The spring clamp 30 is then mounted on the circuit board 12 and lightly clamps the component 10 to the heat sink 20; thus enabling an efficient soldering process. Once soldering of the component is complete, the housing cover member 40 is positioned over the circuit board 12 to encapsulate the component 10. The housing member 40 is provided with a sleeve portion 50 which sandwiches the component 10 between the spring 30 and the heat sink 20.

In a second embodiment of the invention, the sleeve portion 50 is replaced by a sleeve member 60 which is affixed to the housing cover member 40 (FIG. 3). Similar to the embodiment of FIG. 2, first and second walls 62 and 64 fit over the component 10 in a manner to sandwich the component between the spring clamp 30 and the heat sink 20. The sleeve member 60 shown in FIG. 3 is affixed to the housing cover member 40 by a fixing member 60a, i.e. a screw, or a snap clip, received in an aperture provided in member 40. It should be noted, however, that any suitable affixing means may be employed to secure the independently formed sleeve member 60 to the housing member 40 so as to ensure optimum heat dissipation and to stabilize the component 10 within the electrical equipment.

Therefore, independently formed sleeve member 60 may be designed to correspond to the shape of various known electrical components, i.e. transistor, transformer, inductor and the like, to provide a standardized member which may be positioned at any location on the housing member 40. Depending on the arrangement of the electrical components on the circuit board 12, the sleeve members 60 may be respectively positioned on the housing 40 to ensure optimum heat dissipation from the component 10, and to stabilize the component 10 within the electrical equipment.

FIG. 5 illustrates a third embodiment of the instant invention wherein the sleeve member 70 serve to bias the electrical component 10 against the heat sink 20 without the aid of the spring clamp 30. For the embodiment of FIG. 5, the electrical component 10 is soldered to the circuit board 12 in an abutting manner with respect to the heat sink 20 absent the spring clamp 30. Thereafter, the sleeve member 70 which forms a part of the cover member 40 is fitted over the electrical component 10 and heat sink 20. The first wall 72 of the sleeve member 70 is appropriately formed of resilient material to effectively bias the component 10 against the heat sink 20, thus efficiently dissipate heat from the heat generating component 10. As in the foregoing embodiments, the electrical component 10 and heat sink 12 are sandwiched between the first wall 72 and the second wall 74. It should be understood that the sleeve member 70 of the third embodiment may be integrally formed as a unitary member with the housing 40 or may be separately formed and affixed to the housing 40. Moreover, the second wall 74 may be formed as a wall of the housing or independent of the housing walls so long as it contacts the heat sink 20 in the above described manner.

While the invention has been particularly shown and described with reference to preferred embodiments, it will be understood by those having ordinary skill in the art that various changes in form and detail may be made therein without departing from the spirit and scope of the invention.

I claim:

1. A heat sink for dissipating thermal energy from a heat generating electrical component mounted on a circuit board, said assembly comprising:

a heat sink means for dissipating heat from said electrical component, said heat sink means placed adjacent to said electrical component on a first side thereof;

a resilient means placed adjacent to said electrical component on a second side thereof opposite to said first side; and biasing means including an angled surface affixed to a housing member, the angled surface engaging said resilient means for applying a biasing force to said resilient means when said housing member is positioned about said heat sink and component, thereby to resiliently press said electrical component against said heat sink means.

2. The heat sink assembly according to claim 1, wherein said biasing means comprises a cover member adapted to cover and enclose said circuit board, said cover member having internal opposed surfaces which contact said heat sink means and said resilient means and bias said heat sink means and said resilient means against said electrical component, at least one of said internal opposed surfaces forming an outer wall of said cover member.

3. A method for clamping a heat generating electrical component to a heat sink comprising the steps of:
   mounting said electrical component to a circuit board adjacent said heat sink;
   mounting a resilient clip to said circuit board adjacent said electrical component so as to lightly clamp said electrical component against said heat sink during soldering of said electrical component to said circuit board; and
   affixing a housing member to said circuit board after the soldering of said electrical component to said circuit board, wherein said housing member engages said resilient clip and firmly biases said electrical component toward said heat sink.

* * * * *